United States Patent [19]
Sandstrom

[11] Patent Number: 5,420,877
[45] Date of Patent: May 30, 1995

[54] TEMPERATURE COMPENSATION METHOD AND APPARATUS FOR WAVE METERS AND TUNABLE LASERS CONTROLLED THEREBY

[75] Inventor: Richard L. Sandstrom, Encinitas, Calif.

[73] Assignee: Cymer Laser Technologies, San Diego, Calif.

[21] Appl. No.: 93,352

[22] Filed: Jul. 16, 1993

[51] Int. Cl.$^6$ ................................................ H01S 3/13
[52] U.S. Cl. ...................................... 372/34; 372/20; 372/29
[58] Field of Search ........................ 372/9, 20, 25–34

[56] References Cited

U.S. PATENT DOCUMENTS

| | | | |
|---|---|---|---|
| 4,683,573 | 7/1987 | Albanese | 372/34 |
| 4,725,854 | 2/1988 | Ohtsuka et al. | 372/29 X |
| 4,792,956 | 12/1988 | Kamin | 372/29 |
| 5,025,445 | 6/1991 | Anderson et al. | 372/20 |
| 5,033,114 | 7/1991 | Jayaraman et al. | 372/28 X |

Primary Examiner—John D. Lee
Attorney, Agent, or Firm—Blakely, Sokoloff, Taylor & Zafman

[57] ABSTRACT

Temperature compensation method and apparatus for wave meters and tunable lasers controlled thereby which avoids the necessity of maintaining a good vacuum in the wave meter housing and which provides the quick establishment of wave length accuracy after laser turn on before temperature stability in the wave meter is reached. In accordance with the method, the wave meter housing is filled preferably with one atmosphere of dry nitrogen, and the wave meter output is corrected for temperature effects by combining the uncorrected or raw wave meter output with an appropriate wave meter temperature dependent component and an additional appropriate rate of change of wave meter temperature dependent component. The net result is the achievement of accuracy and stability in the wave meter output without use of an oven and before a steady state operating temperature is attained.

22 Claims, 2 Drawing Sheets

TEMPERATURE COMPENSATION METHOD AND APPARATUS FOR WAVE METERS AND TUNABLE LASERS CONTROLLED THEREBY

BACKGROUND OF THE INVENTION

1. Field of the Invention

The present invention relates to the field of wave meters for accurately determining the wavelength of light, such as the wavelength of the emission or a component of the emission of a laser.

2. Prior Art

It may be desired in various applications to accurately measure the wavelength of light (within or without the visible spectrum) or a component part thereof so that such wavelengths will be accurately known. In some applications, it is desired to measure the wavelength of the light to determine its variance from a predetermined desired wavelength, either to determine the error in the wavelength or to provide an error signal, preferably a proportional error signal, which may be used to correct the deviation from the desired wavelength. Since the drift in the setting of a tunable laser will be excessive in applications requiring precise wavelength setting and control, it is preferable to provide a high accuracy measurement of the wavelength of the emission of the laser and to use the same in a closed loop system to null the error, providing wavelength control of the laser emission substantially within the accuracy of the wavelength measurement.

A system for and method of regulating the wavelength of a light beam such as in a tunable laser is disclosed in U.S. Pat. No. 5,025,445. The system disclosed therein splits out approximately 5% of the laser emission and provides both a coarse and fine wavelength measurement thereof to provide a real-time correction of the wavelength of the laser emission. The fine measurement provides high accuracy within a narrow wavelength band, though in essence repeats in corresponding adjacent narrow wavelength bands so as to provide a possible ambiguity in the true wavelength being measured. The coarse measurement, on the other hand, spans the bands of ambiguity to resolve the same, allowing the accurate measurement of the wavelength of the laser emission without ambiguity.

It is stated in the '445 patent that the system disclosed therein which includes an etalon may be disposed in an evacuated housing or a housing filled with a suitably inert material such as nitrogen, and that the same "is not affected by atmospheric changes in temperature and pressure." The extent to which the statement is true, of course, depends upon the degree of accuracy desired. For the most demanding applications such as, by way of example, fixed wavelength deep ultraviolet light sources (excimer lasers) for photolithographic semiconductor integrated circuit fabrication processes utilizing the latest sub-micron line widths, extreme stability in the ultraviolet wavelength is desired. In such applications, temperature sensitivity of the wave meter in general and of the etalon in particular needs to be eliminated to the maximum extent possible.

As stated in the '445 patent, the etalon assembly may be disposed in a housing "filled" with a vacuum, in which case, in theory, the index of refraction between the reflecting surfaces of the etalon will be and remain constant at the index of refraction of free space (1.0). However, a good vacuum is difficult to maintain. A high quality vacuum requires an enclosure which may be pumped down to a very high level of evacuation and then hermetically sealed. The vacuum requirement also limits the nature of the materials which may be used within the enclosure to those having low outgassing characteristics (low moisture and other gaseous absorption and/or inherent volatile component content). It also indirectly limits physical configurations, in that air spaces having limited communication to the vacuum region will pump down very slowly, or alternatively continue to bleed gas into the vacuum region long after one believes a good vacuum is achieved and the enclosure has been sealed off. By way of specific example, screws holding parts together within a vacuum enclosure can trap a substantial amount of gas in the bottom of the hole into which the screw is threaded, within the thread region and within the screw shank clearance hole or holes of the parts retained by the screws. This gas may take days or even weeks to leak out into the main evacuated area and particularly between the etalon mirrors, to cause an increase in the index of refraction of the now partly gaseous filled space between the etalon mirrors, causing a deviation in the wavelength sensing thereof. Finally, providing an enclosure capable of maintaining a relatively hard vacuum and obtaining the same is expensive, and makes the product difficult to service at the factory and essentially non-field serviceable.

Also as mentioned in the '445 patent, the etalon assembly may alternatively be filled with an inert gas such as nitrogen. This has the advantage of eliminating any of the problems associated with obtaining and maintaining a relative hard vacuum. However, since the volume of the enclosure containing the nitrogen changes somewhat with temperature due to the thermal coefficient of expansion of the enclosure materials, the density of the nitrogen in the enclosure will be dependent on temperature, resulting in a variable index of refraction of the gas between the etalon mirrors dependent on the temperature at which the etalon and enclosure stabilizes.

Since the etalon output will drift with temperature more than can be tolerated in the most exacting applications, etalon stability has been enhanced in the prior art by effectively placing the etalon or entire wave meter in a small oven-like structure and elevating the temperature thereof to a predetermined stable temperature which may be maintained by an appropriate controller irrespective of changes in ambient temperature. Such temperature control can substantially enhance the accuracy of the wave meter once the desired temperature has been achieved and the system including the temperature controller stabilized. However, this requires a substantial amount of time from a "cold" start of the laser system before the desired accuracy and stability in the wavelength measurements are obtained. To reduce the startup time, the etalon and/or the entire wave meter heating system may be left on and thus stabilized at the elevated temperature even when the laser is turned off. Aside from the inconvenience and the waste of power in doing this, the reduction in start-up time achieved is limited because of the change in heat load on the oven due to the step change in heat given off by the rest of the laser system when the same is turned on. In particular, on/off type controllers would provide continuous and unacceptable thermal transients to the etalon and the rest of the wave meter, resulting in cyclic and excessive inaccuracies thereof. More modern controllers stabilize to a substantially uniform power output based upon the heat load (dissipation) of the heated portion of the system to maintain a substantially constant temperature under stable quiescent conditions, but will also provide excessive temperature excursions around the desired temperature when the laser system is first turned on until there is an ample opportunity for the system to re-stabilize at the new heat load. Consequently the always on oven approach also exhibits transient characteristics much like the warm-up requirement when the laser system and wave meter is first turned on during a cold startup.

BRIEF SUMMARY OF THE INVENTION

Temperature compensation method and apparatus for wave meters and tunable lasers controlled thereby is disclosed which avoids the necessity of maintaining a good vacuum in the wave meter housing and which provides the quick establishment of wave length accuracy after laser turn on before temperature stability in the wave meter is reached. In accordance with the method, the wave meter housing is filled preferably with one atmosphere of dry nitrogen, and the wave meter output is corrected for temperature effects by combining the uncorrected or raw wave meter output with an appropriate wave meter temperature dependent component and an additional appropriate rate of change of wave meter temperature dependent component. The net result is the achievement of accuracy and stability in the wave meter output without use of an oven and before a steady state operating temperature is attained. This allows the wave meter to be off when the laser is off and to have a relatively short time to accuracy on turn on, and avoids the longer time to settle characteristic of wave meters temperature maintained by an appropriate temperature controller. It also avoids heating the wave meter above the temperature it would settle to naturally during operation. In particular, ovens, to be effective and to have control headroom, must heat the temperature controlled device above the temperature it would settle to naturally if not in an oven. This has the undesirable effect of increasing operating temperature and temperature cycling ranges, both detrimental to life and stability in precision devices, and further increases the outgassing of gases otherwise trapped in substantially closed cavities and materials in a wave meter housing, which can effect accuracy by changing the amount and mix of the free gas in the wave meter.

DETAILED DESCRIPTION OF THE INVENTION

The preferred embodiment of the present invention provides an improvement to the system for and method of regulating the wavelength of a light beam of the general type disclosed in U.S. Pat. No. 5,025,445, the disclosure of which is hereby incorporated by reference. Accordingly, the preferred embodiment of the present invention will be described herein in relation to that system.

In the wave meter disclosed in the '445 patent, both the etalon and the coarse diagnostic assembly operate within the local environment of sealed housings, which in the preferred embodiment of the present invention are filled to one atmosphere of nitrogen. In a sealed enclosure filled with a gas, such as the etalon housing filled with a gas such as nitrogen, the total mass of the gas within the enclosure is a fixed quantity. Since the internal volume of the enclosure varies with temperature at the rate of three times the coefficient of linear expansion of the enclosure material $[V=V_o(1+\Delta 1)^3 = V_o(1+3\Delta 1 + 3\Delta 1^2 + \Delta 1^3) \approx V_o(1+3\Delta 1)]$, the gas density will also vary inversely as the volume. This variation in gas density with temperature changes will change the index of refraction of the gas between the etalon plates and cause errors in the wavelength data.

In addition to the aforementioned effects of temperature on the index of refraction of the gas residing between the etalon plates, the etalon structure itself is temperature sensitive. In the preferred embodiment, the plates of the etalon are precisely spaced by three spacers made from a suitable low expansion material, such as Zero-Dur. Expansion of these spacers with temperature change will cause errors in the etalon output pattern of a magnitude which may be similar to the changes introduced by variations in the gas density. These two effects, spacer expansion and gas density changes due to expansion of the enclosure, sum to give a single coefficient relating errors in the wave meter reading to the temperature of the etalon and its enclosure.

Figure 1:
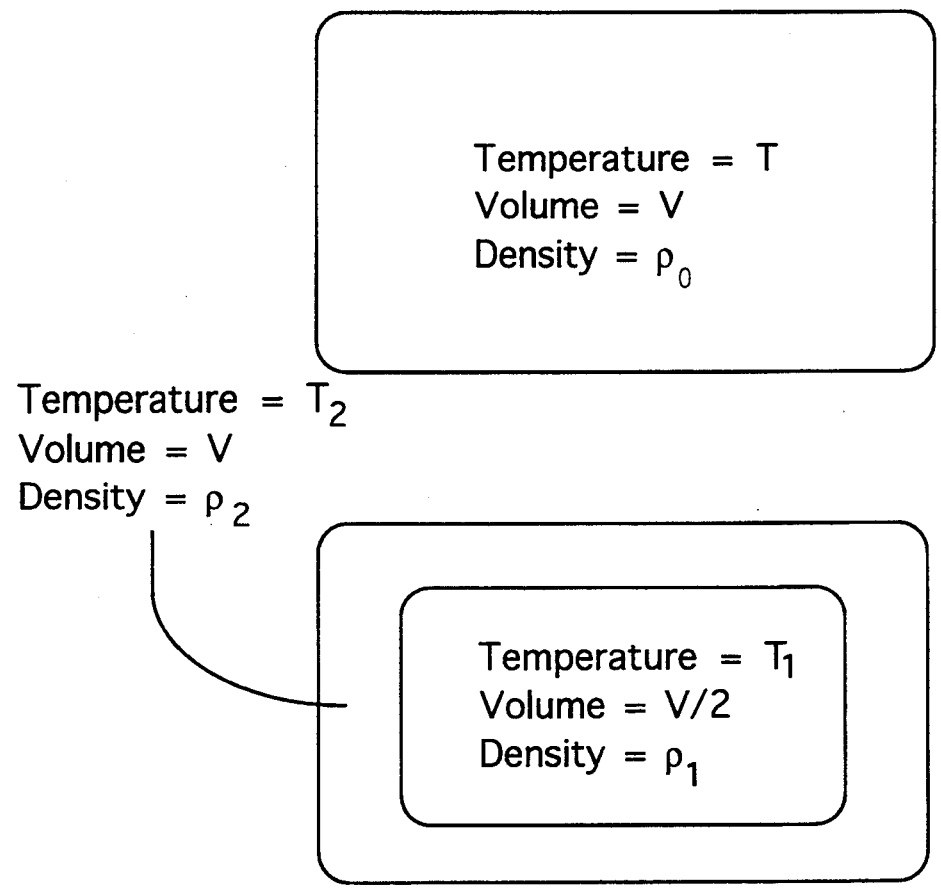
FIG. 1 is a diagram illustrating the effect of temperature differences within a sealed enclosure on pressure and density of respective parts of the gas within the enclosure.

If the temperature of the gas is not uniform within the enclosure, as will be the case of a rising or falling enclosure temperature, then yet another source of error can arise. Referring to FIG. 1, if region 1 of the gas within the enclosure is at a temperature $T_1$ and region 2 is at a temperature $T_2$, then because the pressure will still be uniform throughout the enclosure, the density $\rho_1$ of the gas in region 1 and the density $\rho_2$ of the gas in region 2 will no longer be equal, but instead $\rho_2/\rho_1 = T_1/T_2$. In general, the cooler gas regions will have a higher density and the warmer gas regions will have a lower density than the steady state temperature density $\rho_0$. For purposes of illustration, assume one half of the gas in the enclosure volume V is at temperature $T_1$ and one half of the gas is at temperature $T_2$, as illustrated in the lower portion of FIG. 1. The mass of the gas in the enclosure, which is still fixed, is proportional to the density times the volume. Thus using $\rho_2/\rho_1 = T_1/T_2$:

$$\rho_0 V = \rho_1 V/2 + \rho_2 V/2 = \rho_1 V/2 + \rho_1 T_1 V/2T_2 = \frac{\rho_1 V}{2}(1 + T_1/T_2)$$

$$\rho_0 \rho_1 = (\tfrac{1}{2})(1 + T_1/T_2)$$

For an increasing housing temperature, $T_1 < T_2$, and $\rho_1 > \rho_0$

For a decreasing housing temperature, $T_1 > T_2$, and $\rho_1 < \rho_0$

Since the index of refraction of the gas in the etalon directly effects the interference pattern (as well as the wavelength versus angle for the relevant refracted component of the light from the grating in the coarse diagnostic assembly), and the index in turn is effected by the density of the gas in the etalon, temperature differences in the gas in various regions of the gas enclosure will directly effect the etalon accuracy, even if the etalon and the gas therein remains at a fixed temperature. Thus one can expect the output of an etalon filled with a gas to have some sensitivity to thermal expansion of the sealed enclosure, as well as a definite and substantial sensitivity to the rate of change in the temperature. Since the heat in the assembly enters and exits through the housing outer walls, the changing temperature is best sensed by a thermistor or other temperature sensing element in direct contact with the wall of the housing, preferably in the region most subjected to heating when the laser is turned on so as to more accurately sense the change in temperature giving rise to this effect. (Sensing the temperature changes on the last element to be heated by a change in external temperature would be least desirable for this effect, as the change in temperature of the last element to be heated may mean that a prior, unsensed temperature difference between the housing and the internal parts is actually now decreasing, diminishing the effect described.) The temperature sensor preferably is contained within the housing enclosure to be protected as well as responsive only to housing temperature, though alternatively it may be external thereto so long as it accurately responds to housing temperature and temperature changes. Actually a thermistor or other common sensing device senses temperature, not rate of change of temperature, though the rate of change of temperature may be determined by the microprocessor 16 of FIG. 2 by periodically reading the temperature of the sensor and calculating the rate of change therefrom. As shall be subsequently shown, the stability of the temperature sensor, that is, its ability to indicate temperature changes over a period of time without its own drift being a major factor, is more important than its absolute temperature accuracy, as relatively small changes in temperature with time have as big an effect on the etalon stability and accuracy as larger errors in absolute temperature.

Figure 2:
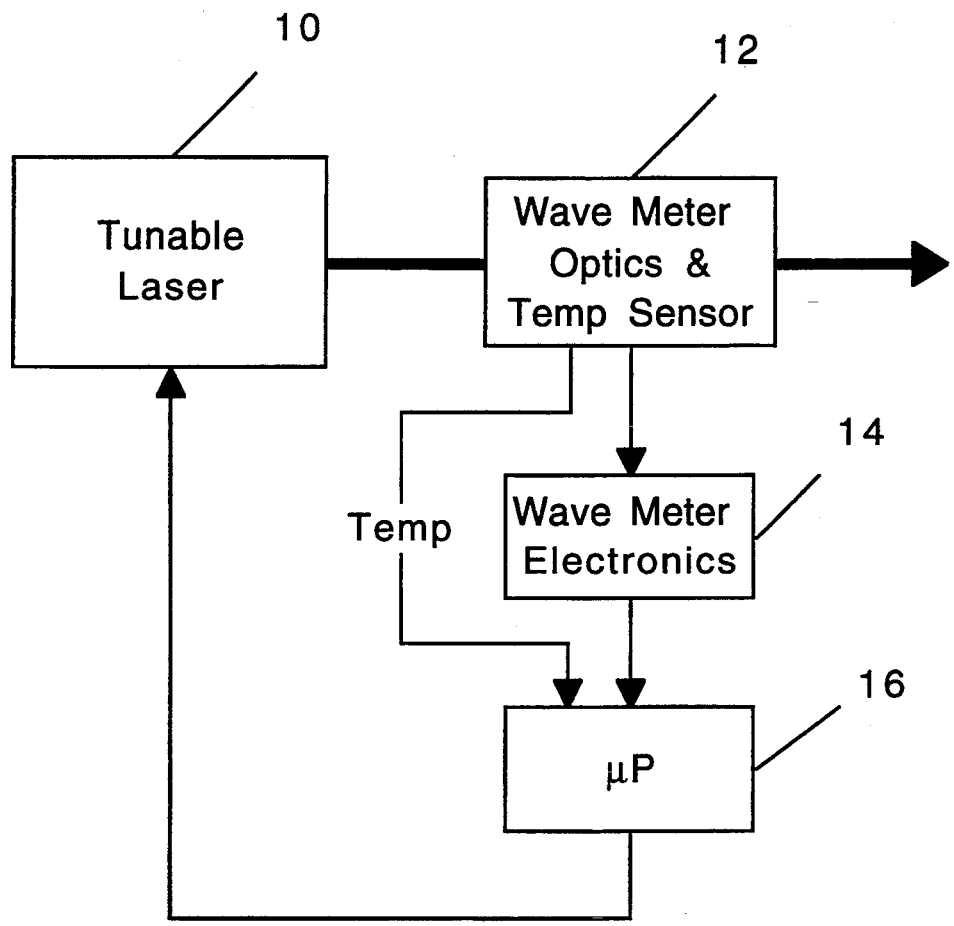
FIG. 2 is a block diagram illustrating the control of a tunable laser with a wave meter incorporating the present invention temperature and rate of change of temperature error compensation.

Now referring specifically to FIG. 2, a tunable laser controlled by a wave meter incorporating the present invention compensation system may be seen. In this Figure, the emission from tunable laser 10 is directed through wave meter optics 12 within which a small fraction of the emission is split out from the main beam for wave length measurement purposes. A scanner and associated wave meter electronics 14 provides interference pattern information to the microprocessor 16 which, in the prior art, is used by the microprocessor to determine the wavelength of the light, and to provide a control signal to control the tuning of the laser 10. However, in accordance with the present invention, the signal indicative of the output of the wave meter is first corrected for temperature effects before being used as the wave meter output and as a source of the control signal to control the tuning of the laser 10.

In particular, the microprocessor 10 periodically senses the output of the temperature sensor located in the housing of the wave meter optics as previously described, and from such readings provides a measure of the current temperature of the wave meter, preferably relative ($\Delta T$) to a nominal temperature for which the wave meter output needs no correction. It also stores one or more of these temperature readings and determines from the latest two or more readings and the time there between the time rate of change of the temperature of the wave meter ($\Delta T/\Delta t$). It then calculates, and periodically updates, a corrected wave meter output in accordance with the equation:

$$\lambda_{corr} = \lambda_{etalon} + k_1 \Delta T + k_2 \Delta T/\Delta t$$

where:
$\lambda_{corr}$ = the corrected wave meter output
$\lambda_{etalon}$ = the wave length reading of the etalon
$k_1$ = the coefficient of temperature sensitivity of the etalon
$k_2$ = the coefficient of sensitivity of the etalon to rate of change of temperature The coefficients $k_1$ and $k_2$ could be determined for each individual wave meter, though are most practically determined for each design, as unit to unit variations will be small compared to the magnitude of the corrections made by coefficients predetermined empirically and applied to all units of a given design. Also while higher order coefficients could also be used, such effects should be smaller, less accurate in estimation and correction and to the extent significant, the effects thereof would stabilize much faster anyway.

In terms of values, a wave meter generally in accordance with the exemplary wave meter described herein exhibits measured approximate coefficients of $k_1 = 0.1$ parts per million per ° C. and $k_2 = 6$ parts per million per ° C. per minute. If the temperature changed just 1 ° C. in 5 minutes, the $k_2$ dependent correction would be $6/5 = 1.2$ parts per million in wave length reading. A temperature change which would give an equal $k_1$ dependent correction would be $1.2/0.1 = 12°$ C. Thus while the accuracy of the temperature sensor in absolute terms is not particularly critical, its stability and repeatability of reading is very important, as accurately providing data from which the presence (or absence) of temperature changes in the low fraction of a degree per minute are important to the operation of the present invention.

Consequently in accordance with the present invention, the signal indicative of the output of the wave meter is corrected for its sensitivity to temperature and for its sensitivity to the rate of change of temperature before being used as the wave meter output and as a source of the control signal to control the tuning of the laser. This provides greater accuracy of the wave meter in any event, and allows shut down and startup of the wave meter with the laser without use of an oven for the wave meter and with a much reduced startup time to specified accuracy, even though the temperature of the wave meter does not fully stabilize within that startup time.

While the preferred embodiment of the present invention has been disclosed and described herein, it will be obvious to those skilled in the art that various changes in form and detail may be made therein without departing from the spirit and scope thereof.

I claim:

1. A system for providing a signal responsive to the wave length of light stabilized for variations in temperature comprising:
   a wave meter for providing a wave meter signal responsive to the wave length of light incident thereto;
   a sensor for providing a temperature signal responsive to a temperature associated with the wave meter; and,
   means responsive to the wave meter signal and the temperature signal to combine the wave meter signal, the temperature signal and the time rate of change of the temperature signal, each having a relative weighting selected to provide a signal responsive to the wave length of the light incident to the wave meter and stabilized for variations in temperature.

2. The system of claim 1 wherein the means responsive to the wave meter signal and the temperature signal to combine the wave meter signal, the temperature signal and the time rate of change of the temperature signal comprises a microprocessor.

3. The system of claim 1 wherein the wave meter is contained within a closed wave meter housing and the sensor for providing a temperature signal responsive to a temperature associated with the wave meter is positioned to respond to the temperature of the housing wall.

4. The system of claim 3 wherein the sensor for providing a temperature signal responsive to a temperature associated with the wave meter is positioned within the enclosure defined by the housing.

5. The system of claim 4, wherein the housing is filled with a gas.

6. The system of claim 5, wherein the housing is filled with nitrogen at approximately one atmosphere.

7. The system of claim 6, wherein the wave meter includes an etalon.

8. The system of claim 3, wherein the housing is filled with a gas.

9. The system of claim 8 wherein the housing is filled with nitrogen at approximately one atmosphere.

10. The system of any one of claims 1 through 4 and 9 wherein the wave meter includes an etalon.

11. A laser system for providing a laser output of a selected and stable wave length comprising:
a laser tunable in response to a laser control signal a wave meter for providing a wave meter signal responsive to the wave length of light incident thereto from the laser;
a sensor for providing a temperature signal responsive to a temperature associated with the wave meter; and,
means responsive to the wave meter signal and the temperature signal to provide the laser control signal to the laser by combining the wave meter signal, the temperature signal and the time rate of change of the temperature signal, each with a relative weighting selected to provide the laser control signal responsive to the wave length of the laser emission incident to the wave meter and stabilized for variations in temperature.

12. The laser system of claim 11 wherein the means responsive to the wave meter signal and the temperature signal to combine the wave meter signal, the temperature signal and the time rate of change of the temperature signal comprises a microprocessor.

13. The laser system of claim 11 wherein the wave meter is contained within a closed wave meter housing and the sensor for providing a temperature signal responsive to a temperature associated with the wave meter is positioned to respond to the temperature of the housing wall.

14. The laser system of claim 13 wherein the sensor for providing a temperature signal responsive to a temperature associated with the wave meter is positioned within the enclosure defined by the housing.

15. The laser system of claim 14, wherein the housing is filled with a gas.

16. The laser system of claim 15, wherein the housing is filled with nitrogen at approximately one atmosphere.

17. The laser system of claim 16, wherein the wave meter includes an etalon.

18. The laser system of claim 13 wherein the housing is filled with a gas.

19. The laser system of claim 18 wherein the housing is filled with nitrogen at approximately one atmosphere.

20. The laser system of any one of claims 11 through 14 and 19 wherein the wave meter includes an etalon.

21. A method of operating a tunable laser comprising the steps of:
(a) providing a tunable laser having an emission controlled, at least in part, in wave length by a gas filled wave meter having a sensitivity to the index of the gas filling the wave meter;
(b) sensing the temperature of the wave meter enclosure and the rate of change of the enclosure temperature;
(c) correcting the output of the wave meter by a temperature dependent compensation factor and by an additional rate of change of temperature dependent compensation factor to obtain a corrected wave meter output; and,
(d) controlling the wavelength of the emission of the tunable laser responsive to the corrected wave meter output.

22. The method of claim 21 wherein the coefficients of the temperature dependent compensation factor and the additional rate of change of temperature dependent compensation factor are predetermined empirically from previous testing of devices of like design.

* * * * *

UNITED STATES PATENT AND TRADEMARK OFFICE
CERTIFICATE OF CORRECTION

PATENT NO. : 5,420,877
DATED : May 30, 1995
INVENTOR(S) : Sandstrom

It is certified that error appears in the above-identified patent and that said Letters Patent is hereby corrected as shown below:

Col. 7,
In Claim 11 at line 34 - 37 change
"a laser tunable in respone to a laser control signal a
    wave meter for providing a wave meter signal
    responsive to the wave length of light incident
    thereto from the laser"

to

--a laser tunable in response to a laser control signal
  a wave meter for providing a wave meter signal
    responsive to the wave length of light incident
    thereto from the laser--

Signed and Sealed this

Seventh Day of May, 1996

*Attest:*

BRUCE LEHMAN

*Attesting Officer*      *Commissioner of Patents and Trademarks*